United States Patent
Guo (10) Patent No.: US 11,145,386 B2
(45) Date of Patent: Oct. 12, 2021

(54) CHIP TESTING METHOD, DEVICE, ELECTRONIC APPARATUS AND COMPUTER READABLE MEDIUM

(71) Applicant: Changxin Memory Technologies, Inc., Anhui (CN)

(72) Inventor: Ruei-Yuan Guo, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/176,536

(22) Filed: Feb. 16, 2021

(65) Prior Publication Data

US 2021/0166778 A1 Jun. 3, 2021

Related U.S. Application Data

(63) Continuation of application No. PCT/CN2019/113246, filed on Oct. 25, 2019.

(30) Foreign Application Priority Data

Oct. 26, 2018 (CN) .......................... 201811261790.3

(51) Int. Cl.
*G11C 29/00* (2006.01)
*G11C 29/56* (2006.01)

(52) U.S. Cl.
CPC .. *G11C 29/56004* (2013.01); *G11C 29/56012* (2013.01)

(58) Field of Classification Search
CPC ........ G11C 29/56004; G11C 29/56012; G01R 31/3183; G01R 31/318307;

(Continued)

(56) References Cited

U.S. PATENT DOCUMENTS 5,046,033 A * 9/1991 Andreasen ..... G01R 31/318307
702/119
9,478,313 B2 10/2016 Cui et al.
(Continued)

FOREIGN PATENT DOCUMENTS

CN 101000367 A 7/2007
CN 101118788 A 2/2008
(Continued)

OTHER PUBLICATIONS

PCT International Search Report and the Written Opinion dated Feb. 5, 2020, issued in related International Application No. PCT/CN2019/113246 (6 pages).
(Continued)

*Primary Examiner* — Christine T. Tu
(74) *Attorney, Agent, or Firm* — Sheppard Mullin Richter & Hampton LLP (57) ABSTRACT

A chip testing method, device, electronic apparatus, and computer readable medium are provided, relating to the field of chip testing. The method includes: determining a language rule of a chip to be tested; determining product and timing specifications of the chip to be tested; selecting a test pattern from a test pattern library according to the language rule and the product and timing specifications; generating a test code according to the product and timing specifications and the test pattern; and automatically testing the chip to be tested by using the test code. The chip testing method, device, electronic apparatus and computer readable medium can automatically generate a big-data test code for complex memories, and rapidly generate, in a standardized way, test codes for DDR4 memories of different specifications, thereby improving the efficiency of chip product verification analysis.

15 Claims, 6 Drawing Sheets

(58) Field of Classification Search
CPC ........ G01R 31/31857; G01R 31/31813; G01R 31/31814; G01R 31/318371; G01R 31/318357; G01R 31/31835; G06F 30/33; G06F 30/367; G06F 30/333
USPC ....... 714/718, 741, 742, 733, 734, 738, 724; 703/13, 14, 18, 19, 20
See application file for complete search history.

(56) References Cited

U.S. PATENT DOCUMENTS

| | | | |
|---|---|---|---|
| 9,792,402 B1 | 10/2017 | Ovadia et al. | |
| 2002/0091496 A1 | 7/2002 | Cheng et al. | |
| 2003/0149949 A1* | 8/2003 | Price | G01R 31/318314 716/106 |
| 2005/0108608 A1* | 5/2005 | Chee Hong | G01R 31/318357 714/741 |
| 2015/0180618 A1* | 6/2015 | Liu | H04L 1/243 714/738 |

FOREIGN PATENT DOCUMENTS

| | | |
|---|---|---|
| CN | 104298590 A | 1/2015 |
| CN | 105158673 A | 12/2015 |

OTHER PUBLICATIONS

First Search dated May 26, 2021, issued in related Chinese Application No. 201811261790.3 (2 pages).

\* cited by examiner

CHIP TESTING METHOD, DEVICE, ELECTRONIC APPARATUS AND COMPUTER READABLE MEDIUM

CROSS-REFERENCE TO RELATED APPLICATIONS

This application is a continuation application of International Patent Application No. PCT/CN2019/113246, filed on Oct. 25, 2019, which is based on and claims priority of the Chinese Patent Application No. 201811261790.3, filed on Oct. 26, 2018, and entitled "CHIP TESTING METHOD, DEVICE, ELECTRONIC APPARATUS AND COMPUTER READABLE MEDIUM." The above-referenced applications are incorporated herein by reference in its entirety.

TECHNICAL FIELD

The present disclosure relates generally to the technical field of chip testing and, more specifically, to a chip testing method, apparatus, electronic apparatus, and computer readable medium.

BACKGROUND

With the rapid development in memory technologies and the rapid expansion of the memory market, memory chips with large capacity, fast read/write speed, and low price are dominating the market. To ensure long-term reliability of these memory chips, they need to undergo meticulous high speed tests before being released to the market.

In the related art regarding the testing of memory products, the majority of work need to be manually done by a tester. The tester first needs to confirm a corresponding model and speed for a memory product to be tested, and then a test scheme suitable for the memory product needs to be selected. After the test scheme is selected, the tester also needs to manually write the test codes. Codes need to be written for each test command in a test sequence, and then the memory product can be tested after the codes have been completed.

The chip testing that relies on manually-written codes requires substantial manpower and material resources and thus results in low efficiency of memory testing. Moreover, with the development in memory technologies, more and more high-speed, high-capacity memories come to the market, and chip testing for these memories requires increasingly complicate and voluminous test codes. For high-speed, high-capacity memories, chip testing with big-data test codes that need to be manually written has become a limiting factor in the development of memory testing industry.

Therefore, a new chip testing method, device, electronic apparatus, and computer readable medium that can address the aforementioned issues are desired.

The above information is only used to facilitate understanding the background of the present disclosure and thus may include information that does not constitute prior art known to a person of ordinary skill in the art.

SUMMARY

In view of the limitations of existing technologies described above, the present disclosure provides a chip testing method, device, electronic apparatus, and computer readable medium, which can automatically generate a big-data test code for complex memory and improve chip testing efficiency.

Other features and advantages of the present disclosure will be apparent from the following detailed description or obtained in part from the practice of the disclosure.

One aspect of the present disclosure is directed to a chip testing method. The method may include: determining a language rule of a chip to be tested; determining product and timing specifications of the chip to be tested; selecting a test pattern from a test pattern library according to the language rule and the product and timing specifications; generating a test code according to the product and timing specifications and the test pattern; and automatically testing the chip to be tested by using the test code.

In some embodiments of the present disclosure, the method may further include: generating the test pattern library based on a plurality of test patterns. The plurality of test patterns may include: a fast read operation test pattern, a fast write operation test pattern, a fast read/write operation test pattern, a self-refreshing test pattern, a refreshing test pattern, a ZQ calibration test pattern, a mode register setting test pattern, and a pre-charge power-down test pattern.

In some embodiments of the present disclosure, the chip may comprise a memory chip.

In some embodiments of the present disclosure, the memory chip may be a DDR4 chip.

In some embodiments of the present disclosure, determining the language rule of the chip to be tested may include: determining a language rule for the chip to be tested according to a specification document of the chip to be tested.

In some embodiments of the present disclosure, determining the product and timing specifications of the chip to be tested may comprise: determining a memory cell address, a memory row address, a memory column address, and a memory page size of the chip to be tested; and determining a model identification, a product identification, and parameters of the chip to be tested.

In some embodiments of the present disclosure, selecting a test pattern from a test pattern library according to the language rule and the product and timing specifications may comprise: determining a database of the chip to be tested according to the product and timing specifications; and selecting the test pattern from the test pattern library according to the language rule and the database.

In some embodiments of the present disclosure, selecting a test pattern from a test pattern library according to the language rule and the product and timing specifications may comprise: determining a database of the chip to be tested according to the product and timing specifications; and designating, based on a history product analysis, the test pattern from the test pattern library according to the language rule and the database.

In some embodiments of the present disclosure, generating a test code according to the product and timing specifications and the test pattern may comprise: inserting a timing sequence into the test pattern according to the product and timing specifications to generate the test code.

In some embodiments of the present disclosure, inserting a timing sequence into the test pattern to generate the test code according to the product and timing specifications may comprise: inserting the timing sequence into the test pattern according to the product and timing specifications; and converting the inserted timing sequence by a high-speed test machine to generate the test code.

Another aspect of the present disclosure is directed to a chip testing device. The device may include: a parameter reading interface, a code generating module, and a high-speed test machine. The parameter reading interface may be configured to determine a language rule of a chip to be tested, and to determine product and timing specifications of the chip to be tested. The code generating module may be configured to select a test pattern from a test pattern library according to the language rule and the product and timing specifications, and to generate a test code according to the product and timing specifications and the test pattern. The high-speed test machine may be configured to automatically test the chip to be tested using the test code.

In some embodiments of the present disclosure, the device may further include: a test pattern library module. The test pattern library module may be configured to generate the test pattern library based on a plurality of test patterns. The plurality of test patterns may comprise: a fast read operation test pattern, a fast write operation test pattern, a fast read/write operation test pattern, a self-refreshing test pattern, a refreshing test pattern, a ZQ calibration test pattern, a mode register setting test pattern, and pre-charge power-down test pattern.

In some embodiments of the present disclosure, the code generating module may comprise: a selection module, configured to select a test pattern from a test pattern library according to the language rule and a database.

Another aspect of the present disclosure is directed to a chip testing device. The device may include: an information module, a native random pattern creator, a format conversion module, and a test module. The information module may be configured to acquire related information of a chip to be tested. The native random pattern creator may be configured to generate a target test pattern for testing the chip to be tested according to information in the information module and content of a database. The format conversion module may be configured to insert a timing sequence into the target test pattern according to product and timing specifications, and to convert the inserted timing sequence by a high-speed test machine to generate a test code. The test module may be configured to generate an automated test code.

In some embodiments of the present disclosure, the device may further include: a pattern library, configured to store a plurality of test patterns; and a pattern model module, configured to store the target test pattern. The target test pattern may be one of the plurality of test patterns.

Another aspect of the present disclosure is directed to an electronic apparatus. The apparatus may include one or more processors and a memory device. The memory device may be configured to store one or more programs. Upon being executed by the one or more processors, the one or more programs may cause the one or more processors to perform the chip test method in any of the aforementioned embodiments.

Another aspect of the present disclosure is directed to a computer readable medium storing a computer program executable by a processor. Upon being executed by the processor, the computer program may cause the processor to perform the chip test method of any of the aforementioned embodiments.

According to the chip testing method, device, electronic apparatus and computer readable medium of the present disclosure, a flexible architecture may be constructed specifically for the DDR4 memory test, and the DDR4 memory test code may be automatically generated according to the product specification. A big-data test code of for complex memories may be automatically generated, thereby improving the efficiency of chip product verification analysis.

It should be understood that the above general description and the following detailed description are merely exemplary, and it is not intended to limit the disclosure.

BRIEF DESCRIPTION OF THE DRAWINGS

The above and other objectives, features, and advantages of the present disclosure will become more apparent after reading the exemplary embodiments in view of the accompanying drawings. The drawings described below are only some of the embodiments of the present disclosure, and those skilled in the art can obtain other drawings based on these drawings without any creative work.

DETAILED DESCRIPTION OF THE EMBODIMENTS

Exemplary embodiments will now be described in detail with reference to the accompanying drawings. However, the exemplary embodiments can be embodied in a variety of forms and should not be construed to be limited by the embodiments set forth herein. Instead, providing such embodiments may make the present disclosure comprehensive and complete, and completely convey the concept of the present disclosure to those skilled in the art. The same reference numerals in the drawings denote the same or similar parts, and the repeated description thereof will be omitted.

It shall be understood that, although the terms first, second, third, etc. may be used herein to describe various components, these components shall not be limited by these terms. These terms are used to distinguish one component from another. Thus, a first component discussed below could be termed a second component without departing from the teachings of the present disclosure. The term "and/or" as used herein includes any and all combinations of one or more of the associated listed items.

It shall be understood by those skilled in the art that the drawings are only a schematic diagram of the exemplary embodiments, and the modules or processes in the drawings are not necessarily required to implement the disclosure, and therefore are not intended to limit the scope of the disclosure.

Figure 1:
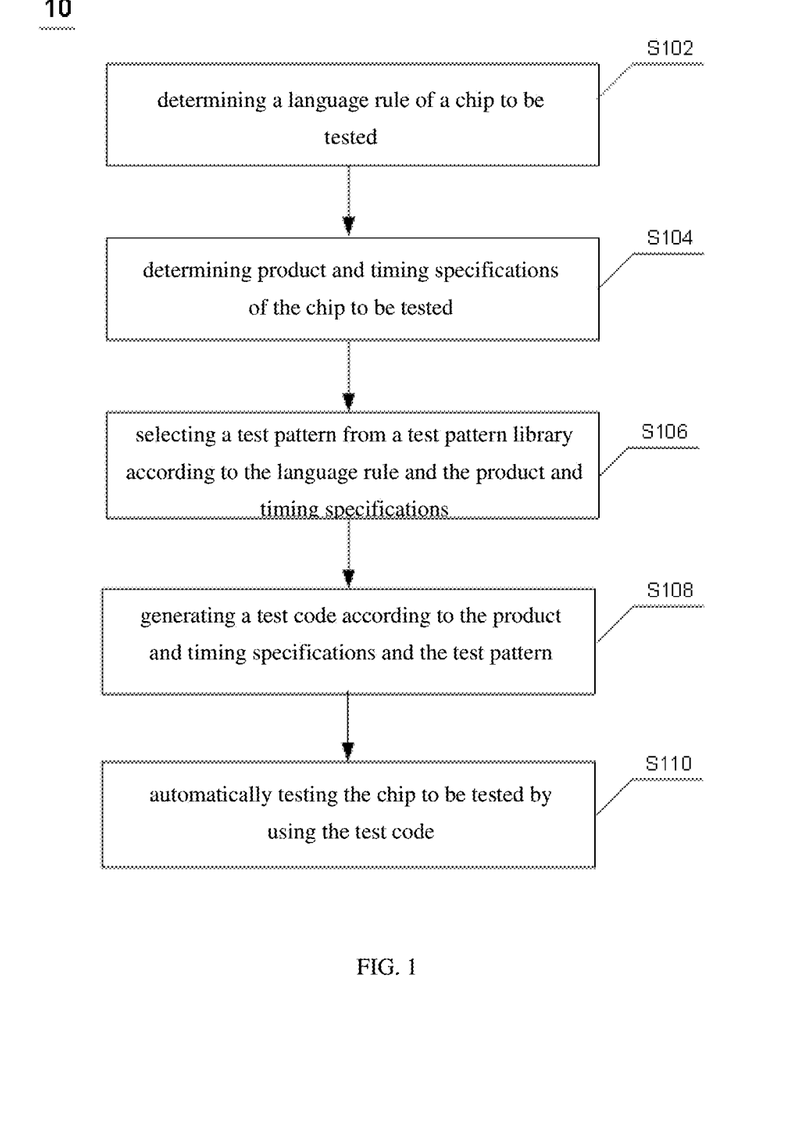
FIG. 1 shows a flow chart illustrating a chip testing method in accordance with one embodiment of this invention.

FIG. 1 shows a flow chart showing a chip testing method according to an exemplary embodiment. The chip testing method 10 may include at least steps S102 to S110.

As shown in FIG. 1, in step S102, a language rule of a chip to be tested may be determined. The chip to be tested may include: a memory, which may specifically be, for example, DDR4 memory. The language rule of the chip to be tested can be determined according to a specification document of the chip to be tested.

In this application, "DDR" or "DDR SDRAM" may refer to a dual data rate synchronous dynamic random access memory. DDR4 memory is a new generation of memory specifications. Compared with DDR3, a previous generation of memory specifications, DDR4 has a 16-bit prefetch mechanism. At the same core frequency, the theoretical speed of DDR4 is twice that of DDR3. DDR4 has more reliable transmission specifications, and thus data reliability is further improved. Moreover, DDR4 has a decreased operating voltage of 1.2V, and thus is more energy efficient. DDR4 is also known as the second generation of memory, developed from DDR1, DDR2, DDR3 memory.

In one embodiment, the language rule of DDR4 memory can be acquired by referring to the definition in JEDEC Standard No. 79-4B. JEDEC Standard No. 79-4B is the instruction manual for DDR4 SDRAM, which includes information about the features, functions, AC and DC characteristics, package and ball distribution of DDR4 SDRAM. The purpose of this standard is to define the JEDEC minimum standard for x4\x8\x16 DDR4 SDRAM from 2 Gbit to 16 Gbit.

In one embodiment, the language rule of a memory may also be acquired from other documents depending on the specifications of the memory. These documents may include, for example: DDR SDRAM STANDARD JESD79; DDR2 SDRAM STANDARD JESD79-2; DDR3 SDRAM STANDARD JESD79-3; and SmartTest 7.4.3 Documentation.

In one embodiment, the language rule of a chip may describe the operating logic of the chip. The operating logic may include, for example, when the chip is in an activated state, it can be converted to a memory library activated state by an automatic sequence command, and when the chip is in an idle state, it can be converted to an activated state by executing a command. The operating logic may include other logics relating to the operation of the chip, which is not exhaustively enumerated herein.

In step S104, product and timing specifications of the chip to be tested may be determined.

In one embodiment, determining a product specification of the chip to be tested may include determining a memory cell address, a memory row address, a memory column address, and a memory page size of the chip to be tested.

In one embodiment, determining a timing specification of the chip to be tested may include determining a model identifier, a product identifier, and a parameter of the chip to be tested. The chip to be tested may include DDR4 memory, and the product and timing specifications of the DDR4 memory may be defined in JEDEC Standard No. 79-4B.

The speed class of the DDR4 may include, for example, 3200/2933/2666/2400/2133/1866 and the like.

Table 1 shows a product specification of the chip according to one embodiment.

|  |  | Structure | 1 Gb*4 | 512 Mb*8 | 256 Mb*16 |
|---|---|---|---|---|---|
| Memory cell address | Number of groups |  | 4 | 4 | 2 |
|  | Group address |  | BG0~BG1 | BG0~BG1 | BG0 |
|  | Memory cell address in the group |  | BA0~BA1 | BA0~BA1 | BA0~BA1 |
| Memory row address |  |  | A0~A15 | A0~A14 | A0~A14 |
| Memory column address |  |  | A0~A9 | A0~A9 | A0~A9 |
| Memory page size |  |  | 512 B | 1 KB | 2 KB |
|  |  | Structure | 2 Gb*4 | 1 Gb*8 | 512 Mb*16 |
| Memory cell address | Number of groups |  | 4 | 4 | 2 |
|  | Group address |  | BG0~BG1 | BG0~BG1 | BG0 |
|  | Memory cell address in the group |  | BA0~BA1 | BA0~BA1 | BA0~BA1 |
| Memory row address |  |  | A0~A16 | A0~A15 | A0~A15 |
| Memory column address |  |  | A0~A9 | A0~A9 | A0~A9 |
| Memory page size |  |  | 512 B | 1 KB | 2 KB |
|  |  | Structure | 4 Gb*4 | 2 Gb*8 | 1 Gb*16 |
| Memory cell address | Number of groups |  | 4 | 4 | 2 |
|  | Group address |  | BG0~BG1 | BG0~BG1 | BG0 |
|  | Memory cell address in the group |  | BA0~BA1 | BA0~BA1 | BA0~BA1 |
| Memory row address |  |  | A0~A17 | A0~A16 | A0~A16 |
| Memory column address |  |  | A0~A9 | A0~A9 | A0~A9 |
| Memory page size |  |  | 512 B | 1 KB | 2 KB |

Table 2 shows a timing specification of the chip according to one embodiment:

|  |  | Model identifier | | | |
|---|---|---|---|---|---|
|  |  | DDR4-2400P | | DDR4-2400R | |
|  |  | Product identifier | | | |
|  |  | 15-15-15 | | 16-16-16 | |
| Product parameters | Symbol | min | max | min | max |
| Internal read command to the first data | tAA | 12.50 | 18.00 | 13.32 | 18 |

-continued

| Product parameters | Symbol | Model identifier | | | |
| --- | --- | --- | --- | --- | --- |
| | | DDR4-2400P | | DDR4-2400R | |
| | | Product identifier | | | |
| | | 15-15-15 | | 16-16-16 | |
| | | min | max | min | max |
| Internal read command to read the first data of data inversion (DBI) | tAA_DBI | tAA(min) +3nCK | tAA(max) +3nCK | tAA(min) +3nCK | tAA(max) +3nCK |
| Open (ACT) to internal read or write delay time | tRCD | 12.50 | | 13.32 | |
| Close (PRE) command cycle | tRP | 12.50 | | 13.32 | |
| Open (ACT) to close (PRE) command period | tRAS | 32 | 9*tREFI | 32 | 9*tREFI |
| Open (ACT) to open (ACT) or close (PRE) command | tRC | 44.50 | | 45.32 | |

In step S106, a test pattern may be selected from a test pattern library according to the language rule and the product and timing specifications. For example, step S106 may include: determining a database of the chip to be tested according to the product and timing specifications, and selecting the test pattern from the test pattern library according to the language rule and the database.

In one embodiment, the method may further include generating the test pattern library based on a plurality of test patterns. The plurality of test patterns may comprise: an X-direction/Y-direction fast write operation test pattern (X/Y fast Write pattern), an X direction/Y direction fast read operation test pattern (X/Y fast Read pattern), an X direction/Y direction fast read/write operation test pattern (X/Y fast Write/Read pattern), a self-refreshing test pattern (Self-refresh), a refreshing test pattern (Refreshing), a ZQ calibration test pattern (ZQ calibration), a pre-charge power-down test pattern (Pre-charge Power-down), and a mode register setting test pattern (Mode Register Set).

In one embodiment, selecting a test pattern from a test pattern library according to the language rule and the database may comprise: first selecting a plurality of test patterns that meet the condition in the test pattern library according to the language rule. Then the plurality of test patterns may be subjected to a secondary screening according to the content in the database corresponding to the chip to be tested, so that the patterns that do not meet the requirements of the chip may be removed. Finally, a test pattern may be selected from the rest of the plurality of test patterns.

In one embodiment, the number of selected test pattern may be one or more, which is not limited in this disclosure.

In one embodiment, the method may include: determining a database of the chip to be tested according to the product and timing specifications; and designating the test pattern from the test pattern library according to the language rule and the database. Specifically, the method may comprise: first selecting a plurality of test patterns that meet the condition in the test pattern library according to the language rule. Then the plurality of test patterns may be subjected to a secondary screening according to the content in the database corresponding to the chip to be tested, so that the patterns that do not meet the requirements of the chip may be removed. Finally, according to the expert's opinions or based on the experience from history product analysis, a target test pattern may be designated from the rest of the plurality of test patterns.

In step S108, a test code may be generated according to the product and timing specifications and the test pattern. In one example, step S108 may include: inserting a timing sequence into the test pattern according to the product and timing specifications to generate the test code.

In one embodiment, inserting a timing sequence into the test pattern according to the product and timing specifications to generate the test code may include: inserting the timing sequence into the test pattern according to the product and timing specifications; and converting the inserted timing sequence by a high-speed test machine to generate the test code.

In one embodiment, the high-speed test machine may be an HSM6800 high-speed test machine, and the HSM6800 high-speed test machine may have a programmable function to support the tests for advanced features of GDDR5 (Graphics Double Data Rate, version 5), which includes Address Bus Inversion (ABI), Data Bus Inversion (DBI), and Cyclic Redundancy Check (CRC). In addition, the test machine can test the memory of a common 8-bit data frame (frame) due to its flexible architecture, and can also be extended to test 10-bit data frame memory in the future. Thus the test machine can meet the requirements in performance, functionality and cost for the testing of all kinds of high-speed memories.

In step S110, the chip to be tested may be automatically tested using the test code. An automated test code may be generated by using the programmable function of the HSM6800 high-speed test machine and the language rules of DDR4 memory, which enables the test machine to automatically generate a big-data test code for memories. The generated test code may be used to simulate the system environment test to expedite the die test of the DDR4 memory.

In one embodiment, during the test, each write action may be recorded by the database while the read actions may be generated based on the current contents of the database.

Figure 2:
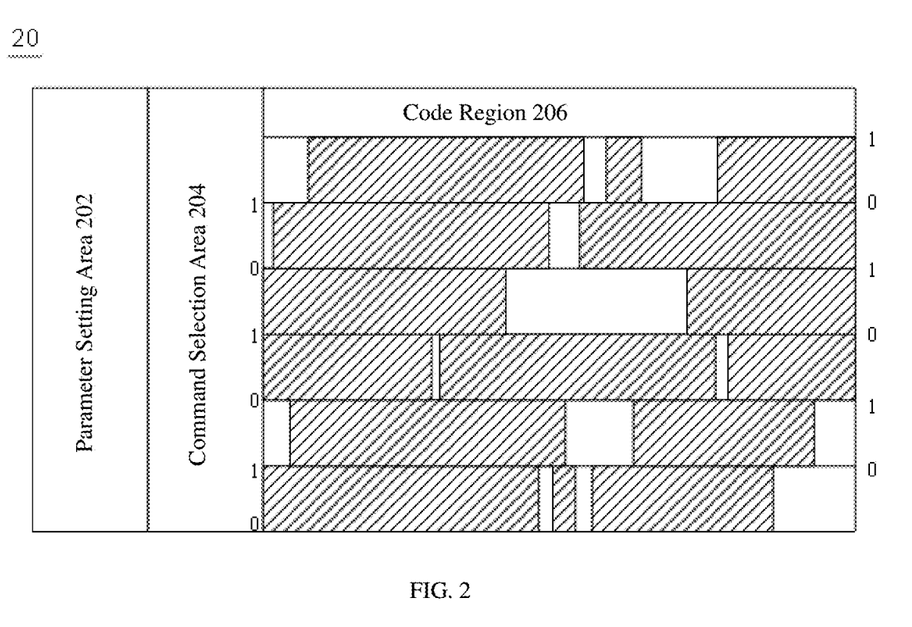
FIG. 2 shows is a schematic diagram of a chip testing method in accordance with one embodiment of this invention.

FIG. 2 shows a schematic diagram of a chip testing method in accordance with one embodiment of this invention. FIG. 2 exemplarily shows a pattern of test codes for DDR4 memories of different specifications rapidly generated by the chip testing method of the present disclosure.

As shown in FIG. 2, the language rule and the product and timing specifications of the chip to be tested may be determined first. Then the test pattern may be selected from the test pattern library according to the language rule and the product and timing specifications. Then the test code may be automatically generated according to the product and timing specifications and the test pattern, and the specific pattern of the test code may be a pulse code composed of 0 or 1.

According to the schematic diagram of the chip testing method as shown in FIG. 2, a user may inspect the relevant test parameters of the test pattern from the parameter setting area 202, and, if necessary, modify the test parameters. The user can inspect various test commands corresponding to the test pattern from the command selection area 204 to further understand the test. A specific test code is shown in the code region 206, and the specific test code consists of a pulse sequence composed of 0 or 1, wherein 1 may represent a high voltage level, and 0 may represent a low voltage level.

According to the chip testing method of the present disclosure, the test pattern may be selected from the test pattern library according to the language rule and the product and timing specifications. The test code may be generated according to the product and timing specifications and the test pattern. Therefore, a big-data test code of complex memory can be generated automatically, and the test codes for DDR4 memories of different specifications can be generated rapidly in a standardized way, thereby improving the efficiency of chip product verification analysis.

According to the chip testing method of the present disclosure, a flexible architecture may be constructed specifically for the DDR4 memory test, and the DDR4 memory test code may be automatically generated according to the content of the product specification. Compared to manually written codes, the automatically-generated codes may be created with much higher efficiency. Thus, the problem associated with manually writing a big-data test code for complex DDR4 memory in the related art can be solved.

According to the chip testing method of the present disclosure, the test codes for DDR4 memories of different specifications can be rapidly generated in a standardized way. Thus human errors that are inevitable in manual coding can be avoided, and the quality of the test codes may be improved.

According to the chip testing method of the present disclosure, detailed coding procedural information can be provided, and each procedure in the test coding can be presented to a human inspector. Therefore, in case an error is reported during a test, the human inspector can perform a positioning analysis according to the test code to quickly identify and remedy any issue, thereby improving the efficiency of the product analysis.

This invention further presents a chip testing device based on the aforementioned chip testing method. The device may be configured to implement the chip testing method according to the embodiments of the present disclosure. Any detail not disclosed herein can be obtained by referring to the embodiments for the method of the present disclosure.

Figure 3:
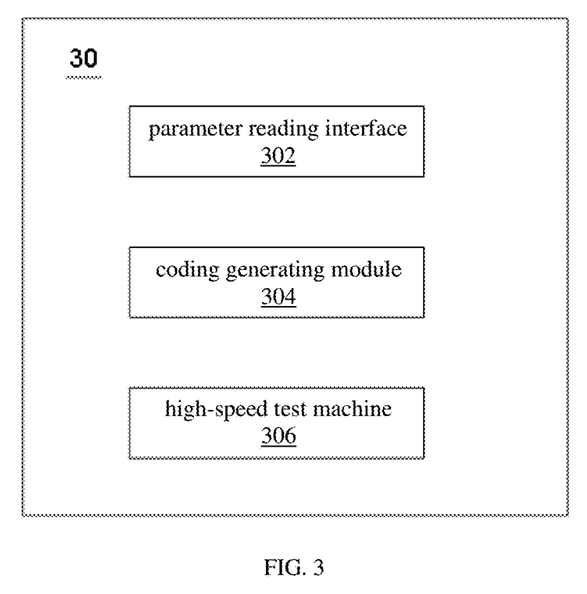
FIG. 3 shows a block diagram of a chip testing device in accordance with one embodiment of this invention.

FIG. 3 shows a block diagram of a chip testing device in accordance with one embodiment of this invention. The chip testing device 30 may include a parameter reading interface 302, a code generating module 304, and a high-speed test machine 306.

The parameter reading interface 302 may be configured to determine a language rule of the chip to be tested, and to determine product and timing specifications of the chip to be tested. The chip to be tested may include: a memory, which may be, for example, DDR4 memory.

In one embodiment, the product and timing specifications of the DDR4 memory and the language specifications of the DDR4 memory may be acquired by referring to the definitions in JEDEC Standard No. 79-4B.

The code generating module 304 may be configured to select a test pattern from a test pattern library according to the language rule and the product and timing specifications, and to generate a test code according to the product and timing specifications and the test pattern.

In one embodiment, the code generating module 304 may determine a database of the chip to be tested according to the product and timing specifications, and select the test pattern from the test pattern library according to the language rule and the database.

In one embodiment, the code generating module 304 may insert a timing sequence into the test pattern according to the product and timing specifications; and convert the inserted timing sequence by a high-speed test machine to generate the test code.

The high-speed test machine 306 may be configured to automatically test the chip to be tested using the test code. An automated test code may be generated by the programmable function of the high-speed test machine 306 and the language rule of the DDR4 memory, which enables the test machine to automatically generate a big-data test code for memory. The generated test code may be used to simulate the system environment test to expedite the die test of the DDR4 memory.

Figure 4:
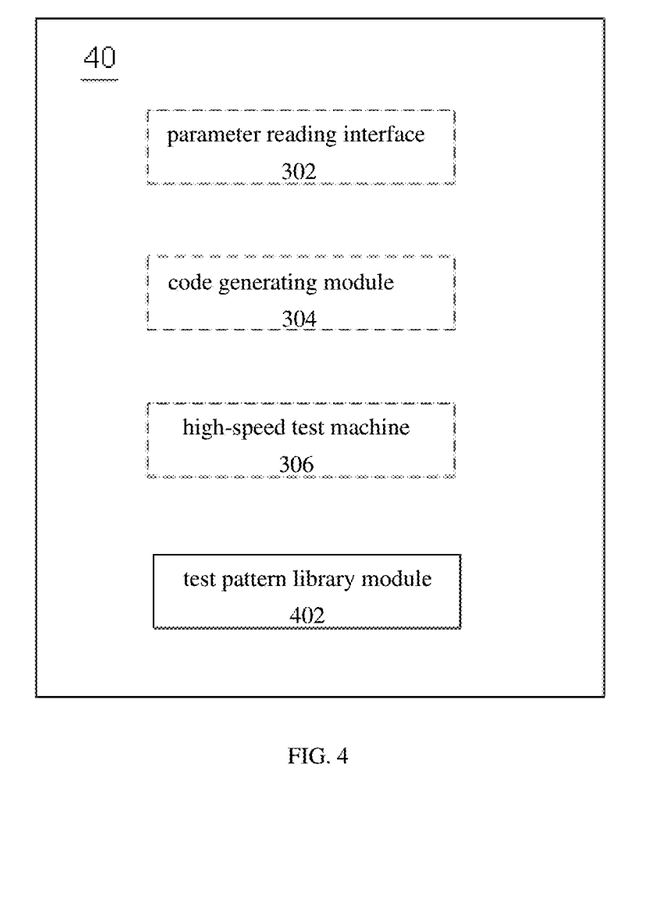
FIG. 4 shows a block diagram of a chip testing device in accordance with another embodiment of this invention.

FIG. 4 shows a block diagram of a chip testing device in accordance with another embodiment of this invention. As shown in FIG. 4, the chip testing device 40 may further include a test pattern library module 402 in addition to the chip testing device 30 of FIG. 3.

The test pattern library module 402 may be configured to generate the test pattern library based on a plurality of test patterns.

In one embodiment, the test pattern library may be generated based on a plurality of test patterns. The plurality of test patterns may include: an X-direction/Y-direction fast write operation test pattern, an X-direction/Y-direction fast read operation test pattern, an X-direction/Y-direction fast read/write operation test pattern, a self-refreshing test pattern, a refreshing test pattern, a ZQ calibration test pattern, a pre-charge power-down test pattern, and a mode register setting test pattern.

According to the chip testing device of the present disclosure, the test pattern may be selected from the test pattern library according to the language rule and the product and timing specifications; and the test code may be generated according to the product and timing specifications and the test pattern. Therefore, a big-data test code of complex memory can be generated automatically, thereby improving the efficiency of chip product verification analysis.

Figure 5:
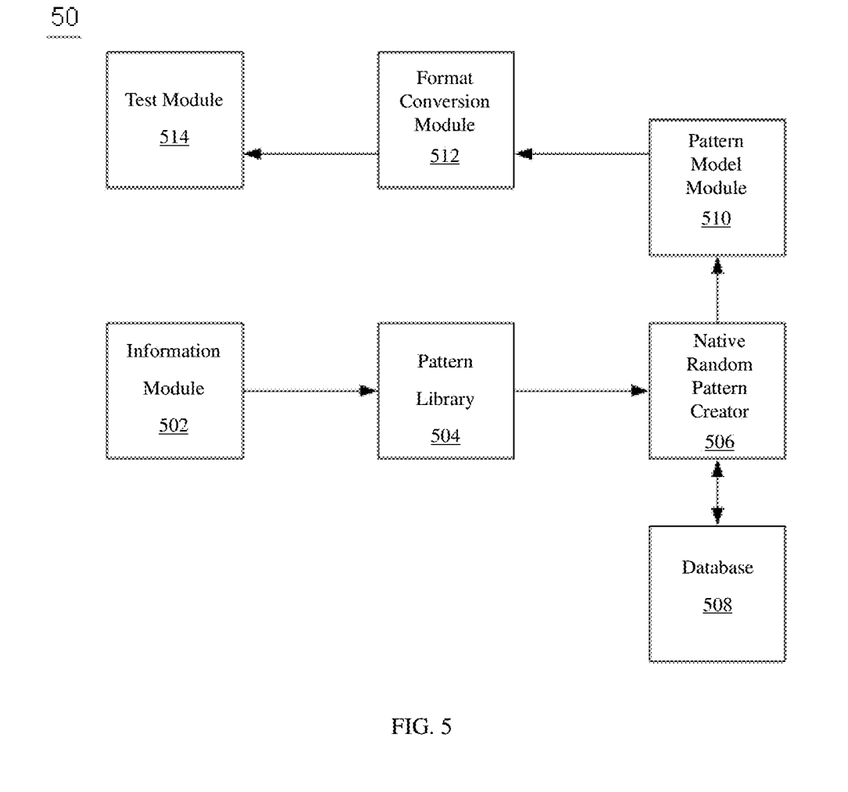
FIG. 5 shows a schematic diagram of a chip testing device in accordance with one embodiment of this invention.

FIG. 5 shows a schematic diagram of a chip testing device in accordance with one embodiment of this invention. As shown in FIG. 5, the chip testing device 50 may include: an information module 502, a pattern library 504, a native random pattern creator 506, a database 508, a pattern model module 510, a format conversion module 512, and a test module 514.

The information module 502 may be configured to acquire related information of a chip to be tested, and the information module 502 may be configured to determine a language rule of the chip to be tested. The information module 502 may also be configured to determine the product and timing specifications of the chip to be tested.

The pattern library 504 may be configured to store a plurality of test patterns. The plurality of test patterns may include, for example, an X-direction/Y-direction fast write operation test pattern, an X-direction/Y-direction fast read operation test pattern, an X-direction/Y-direction fast read/write operation test pattern, a self-refreshing test pattern, a refreshing test pattern, a ZQ calibration test pattern, a pre-charge power-down test pattern, and a mode register setting test pattern.

The native random pattern creator 506 may be configured to generate a test pattern from the pattern library 504 based on the information in the information module 502 and content in the database 508. Based on different combinations of a test pattern from the pattern library 504 and information of the chip to be tested (e.g., the language rule, the product and timing specification of the chip to be tested) in the information module 502, and the content in the database 508, the native random pattern creator 506 may generate a large number of test patterns for testing the chip to be tested.

In some embodiments, the content in the database 508 may include data that may be used to generate the test patterns for testing. Additionally, after a test on a chip is completed, the content in the database 508 may be used to compare with results returned from the test to determine an outcome of the test.

The pattern model module 510 may be configured to store the generated test patterns.

The format conversion module 512 may be configured to insert a timing sequence into the generated test patterns using product and timing specifications, and to convert the inserted timing sequence by a high-speed test machine to generate a test code.

The test module 514 may be configured to generate an automated test code using the programmable function of a high-speed test machine and the language rules of DDR4 memory, which may enable the test machine to automatically generate a big-data test code for memories. The generated test code may be used to simulate the system environment test to expedite the die test of the DDR4 memory.

In some embodiments, the test module 514 may be a high-speed test machine, such as an HSM6800 high-speed test machine.

Figure 6:
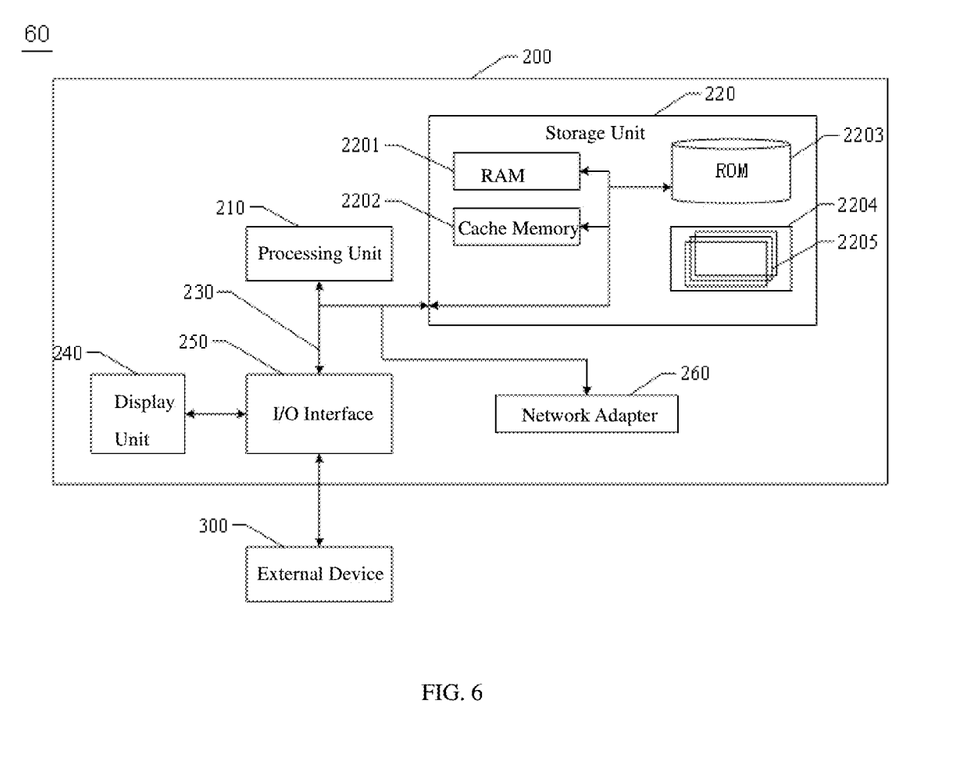
FIG. 6 shows a block diagram of an electronic apparatus in accordance with one embodiment of this invention.

FIG. 6 shows a block diagram of an electronic apparatus in accordance with one embodiment of this invention.

An electronic apparatus 200 according to an embodiment of the present disclosure is described below with reference to FIG. 6. The electronic apparatus 200 shown in FIG. 6 is merely an example and should not limit the scope of function and use of apparatus according to the embodiments of the present disclosure.

As shown in FIG. 6, the electronic apparatus 200 may be implemented as a general-purpose computing device. The components of the electronic apparatus 200 may include, but are not limited to, at least one processing unit 210, at least one storage unit 220, a bus 230 connecting different system components (including the storage unit 220 and the processing unit 210), a display unit 240, and the like.

The storage unit 220 may store a program code, and program code can be executed by the processing unit 210, such that the processing unit 210 performs the method in any of the aforementioned embodiments. For example, the processing unit 210 can perform the method as shown in FIG. 1.

The storage unit 220 may include a readable medium in the form of volatile memory, such as a random access memory (RAM) 2201 and/or a cache memory 2202, and may further include a read-only cache memory (ROM) 2203.

The storage unit 220 may also include a program/utility 2204 having a set (at least one) of the program modules 2205 including but not limited to: an operating system, one or more applications, other program modules, and program data, each of or some combinations of these examples may include an implementation of a network environment.

Bus 230 may represent one or more of several types of bus structures, which may include a storage unit bus or a storage unit controller, a peripheral bus, a graphics acceleration port, a processing unit, or a local bus using any of the bus structures.

The electronic apparatus 200 can also communicate with one or more external devices 300 (e.g., a keyboard, pointing device, Bluetooth device, etc.), and can also communicate with one or more devices that enable the user to interact with the electronic apparatus 200, and/or with any device (e.g., a router, modem, etc.) that enables the electronic apparatus 200 to communicate with one or more other computing devices. The communication can take place via an input/output (I/O) interface 250. Moreover, electronic apparatus 200 can also communicate with one or more networks (e.g., a local area network (LAN), a wide area network (WAN), and/or a public network, such as the Internet) via a network adapter 260. The network adapter 260 can communicate with other modules of electronic apparatus 200 via Bus 230. It should be understood that although not shown in the figures, other hardware and/or software modules may be utilized in conjunction with electronic apparatus 200, including but not limited to: microcode, device drivers, redundant processing units, external disk drive arrays, RAID systems, tape drives, and data backup storage systems, etc.

Based on the description of the above embodiments, those skilled in the art will readily understand that the exemplary embodiments described herein may be implemented by software, hardware, or the combination of software and necessary hardware. Therefore, the technical solution according to an embodiment of the present disclosure may be embodied in the form of a software product, which may be stored in a non-volatile storage medium (which may be a CD-ROM, a USB flash drive, a mobile hard disk, etc.) or on a network. A plurality of commands is included to cause a computing device (which may be a personal computer, server, or network device, etc.) to perform the above method in accordance with an embodiment of the present disclosure, which may include: determining a language rule of a chip to be tested; determining product and timing specifications of the chip to be tested; selecting a test pattern from a test pattern library according to the language rule and the product and timing specifications; generating a test code according to the product and timing specifications and the test pattern; and automatically testing the chip to be tested by using the test code.

It will be understood by those skilled in the art that the above various modules may be distributed in the device according to the description of the embodiments, or may be correspondingly changed in one or more devices different from the embodiment. The modules of the above embodiments may be combined into one module or may be further divided into a plurality of sub-modules.

Based on the description of the above embodiments, those skilled in the art can easily understand that the exemplary embodiments described herein may be implemented by software, or may be implemented by software in combination with necessary hardware. Therefore, the technical solution according to an embodiment of the present disclosure may be embodied in the form of a software product, which may be stored in a non-volatile storage medium (which may be a CD-ROM, a USB flash drive, a mobile hard disk, etc.) or on a network. A plurality of commands are included to cause a computing device (which may be a personal computer, server, mobile terminal, or network device, etc.) to perform a method in accordance with an embodiment of the present disclosure.

The exemplary embodiments of the present disclosure have been particularly shown and described above. It should be understood that the invention is not limited to the details of the embodiments of the disclosure.

The invention claimed is:

1. A chip testing method, comprising:
determining a language rule of a chip to be tested;
determining product and timing specifications of the chip to be tested;
generating, based on a plurality of test patterns, a test pattern library, wherein the plurality of test patterns comprises:
a fast read operation test pattern, a fast write operation test pattern, a fast read/write operation test pattern, a self-refreshing test pattern, a refreshing test pattern, a ZQ calibration test pattern, a mode register setting test pattern, and a pre-charge power-down test pattern;
selecting, according to the language rule and the product and timing specifications, a test pattern from the test pattern library;
generating, according to the product and timing specifications and the selected test pattern, a test code; and
automatically testing, using the test code, the chip to be tested.

2. The chip testing method of claim 1, wherein the chip comprises a memory chip.

3. The chip testing method of claim 2, wherein the memory chip is a DDR4 chip.

4. The chip testing method of claim 2, wherein determining a language rule of the chip to be tested comprises:
determining, according to a specification document of the chip to be tested, a language rule for the chip to be tested.

5. The chip testing method of claim 2, wherein determining product and timing specifications of the chip to be tested comprises:
determining a memory cell address, a memory row address, a memory column address, and a memory page size of the chip to be tested; and
determining a model identification, a product identification, and parameters of the chip to be tested.

6. The chip testing method of claim 1, wherein selecting, according to the language rule and the product and timing specifications, a test pattern from the test pattern library comprises:
determining, according to the product and timing specifications, a database of the chip to be tested; and
selecting, according to the language rule and the database, the test pattern from the test pattern library.

7. The chip testing method of claim 1, wherein selecting, according to the language rule and the product and timing specifications, a test pattern from the test pattern library comprises:
determining, according to the product and timing specifications, a database of the chip to be tested; and
designating, based on a history product analysis and according to the language rule and the database, the selected test pattern from the test pattern library.

8. The chip testing method of claim 1, wherein generating, according to the product and timing specifications and the test pattern, a test code comprises:
inserting, according to the product and timing specifications, a timing sequence into the selected test pattern to generate the test code.

9. The chip testing method of claim 8, wherein inserting, according to the product and timing specifications, a timing sequence into the selected test pattern to generate the test code comprises:
inserting, according to the product and timing specifications, the timing sequence into the selected test pattern; and
converting, by a high-speed test machine, the selected test pattern with the timing sequence to generate the test code.

10. A chip testing device, comprising:
a parameter reading interface, configured to determine a language rule of a chip to be tested, and to determine product and timing specifications of the chip to be tested;
a test pattern library module, configured to generate, based on a plurality of test patterns, a test pattern library, wherein the plurality of test patterns comprises:
a fast read operation test pattern, a fast write operation test pattern, a fast read/write operation test pattern, a self-refreshing test pattern, a refreshing test pattern, a ZQ calibration test pattern, a mode register setting test pattern, and pre-charge power-down test pattern;
a code generating module, configured to select, according to the language rule and the product and timing specifications, a test pattern from the test pattern library, and to generate, according to the product and timing specifications and the selected test pattern, a test code; and
a high-speed test machine, configured to automatically test, using the test code, the chip to be tested.

11. The chip testing device of claim 10, wherein the code generating module comprises:
a selection module, configured to select, according to the language rule and a database, the test pattern from the test pattern library.

12. A chip testing device, comprising:
an information module, configured to acquire related information of a chip to be tested;
a pattern library, configured to store a plurality of test patterns, wherein the plurality of test patterns comprises:
a fast read operation test pattern, a fast write operation test pattern, a fast read/write operation test pattern, a self-refreshing test pattern, a refreshing test pattern, a ZQ calibration test pattern, a mode register setting test pattern, and a pre-charge power-down test pattern;
a native random pattern creator configured to generate a target test pattern for testing the chip to be tested according to information in the information module and content of a database, wherein the target test pattern is one of the plurality of test patterns;
a format conversion module, configured to insert, according to product and timing specifications, a timing sequence into the target test pattern, wherein the target test pattern with the timing sequence is converted, by a high-speed test machine, to generate a test code, wherein the test code is configured to automatically test the chip to be tested using the target test pattern with the timing sequence.

13. The chip testing device of claim 12, further comprising:
a pattern model module, configured to store the target test pattern.

14. An electronic apparatus, comprising:
one or more processors; and
a memory device, configured to store one or more programs;
wherein, upon being executed by the one or more processors, the one or more programs cause the one or more processors to perform operations, comprising:
determining a language rule of a chip to be tested;
determining product and timing specifications of the chip to be tested;
generating, based on a plurality of test patterns, a test pattern library, wherein the plurality of test patterns comprises:
a fast read operation test pattern, a fast write operation test pattern, a fast read/write operation test pattern, a self-refreshing test pattern, a refreshing test pattern, a ZQ calibration test pattern, a mode register setting test pattern, and a pre-charge power-down test pattern;
selecting, according to the language rule and the product and timing specifications, a test pattern from the test pattern library;
generating, according to the product and timing specifications and the selected test pattern, a test code; and
automatically testing, using the test code, the chip to be tested.

15. A non-transitory computer readable medium, storing a computer program executable by a processor,
wherein, upon being executed by the processor, the computer program causes the processor to perform operations, comprising:
determining a language rule of a chip to be tested;
determining product and timing specifications of the chip to be tested;
generating, based on a plurality of test patterns, a test pattern library, wherein the plurality of test patterns comprises:
a fast read operation test pattern, a fast write operation test pattern, a fast read/write operation test pattern, a self-refreshing test pattern, a refreshing test pattern, a ZQ calibration test pattern, a mode register setting test pattern, and a pre-charge power-down test pattern;
selecting, according to the language rule and the product and timing specifications, a test pattern from the test pattern library;
generating, according to the product and timing specifications and the selected test pattern, a test code; and
automatically testing, using the test code, the chip to be tested.

* * * * *

UNITED STATES PATENT AND TRADEMARK OFFICE
CERTIFICATE OF CORRECTION

PATENT NO. : 11,145,386 B2
APPLICATION NO. : 17/176536
DATED : October 12, 2021
INVENTOR(S) : Ruei-Yuan Guo Page 1 of 1

It is certified that error appears in the above-identified patent and that said Letters Patent is hereby corrected as shown below:

In the Claims

In Claim 8, Column 14, Line 6, "test pattern, a test code comprises:" should read --selected test pattern, a test code comprises:--.

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*